(12) United States Patent
Rabe

(10) Patent No.: US 9,997,210 B2
(45) Date of Patent: Jun. 12, 2018

(54) DATA REGISTER FOR RADIATION HARD APPLICATIONS

(71) Applicant: Honeywell International Inc., Morristown, NJ (US)

(72) Inventor: Robert Rabe, Chanhassen, MN (US)

(73) Assignee: Honeywell International Inc., Morris Plains, NJ (US)

( * ) Notice: Subject to any disclaimer, the term of this patent is extended or adjusted under 35 U.S.C. 154(b) by 4 days.

(21) Appl. No.: 14/671,786

(22) Filed: Mar. 27, 2015

(65) Prior Publication Data

US 2016/0283142 A1 Sep. 29, 2016

(51) Int. Cl.
| | | |
|---|---|---|
| *G11C 7/02* | (2006.01) | |
| *G11C 7/22* | (2006.01) | |
| *G11C 27/02* | (2006.01) | |
| *H03K 3/013* | (2006.01) | |
| *H03K 3/356* | (2006.01) | |
| *H03K 3/3562* | (2006.01) | |
| *H03K 19/003* | (2006.01) | |

(52) U.S. Cl.
CPC ............... *G11C 7/02* (2013.01); *G11C 7/222* (2013.01); *G11C 27/02* (2013.01); *H03K 3/013* (2013.01); *H03K 3/35625* (2013.01); *H03K 3/356121* (2013.01); *H03K 19/00338* (2013.01)

(58) Field of Classification Search
CPC ............................... H03K 3/012; H03K 3/027
See application file for complete search history.

(56) References Cited

U.S. PATENT DOCUMENTS

| | | | |
|---|---|---|---|
| 5,311,070 A | 5/1994 | Dooley | |
| 5,870,332 A | 2/1999 | Lahey et al. | |
| 6,172,545 B1* | 1/2001 | Ishii | H03K 5/133 |
| | | | 327/264 |
| 6,362,676 B1 | 3/2002 | Hoffman | |
| 6,456,138 B1 | 9/2002 | Yoder et al. | |
| 6,668,342 B2 | 12/2003 | Wood et al. | |
| 6,897,699 B1* | 5/2005 | Nguyen | G06F 1/10 |
| | | | 327/295 |

(Continued)

FOREIGN PATENT DOCUMENTS

JP    2009105967 A    5/2009

OTHER PUBLICATIONS

Abrishami, H. et al., "Analysis and Optimization of Sequential Circuit Elements to Combat Single-Event Timing Upsets," University of Southern California, Dept. of Electrical Engineering, 2010, retrieved from http://sportlab.usc.edu/~massoud/Papers/Combating-SETU-iscas10.pdf, Jul. 2014, 5 pp.

(Continued)

*Primary Examiner* — Charles Rones
*Assistant Examiner* — Han Doan
(74) *Attorney, Agent, or Firm* — Shumaker & Sieffert, P.A.

(57) ABSTRACT

A circuit comprises a data storage element that includes a sampling stage configured to sample a data value, the sampling stage comprising a plurality of p-type devices, wherein at least one of the plurality of p-type devices is non-collinear relative to the other p-type devices, a plurality of n-type devices, wherein at least one of the plurality of n-type devices is non-collinear relative to the other n-type devices, a feedback stage configured to maintain the data value sampled by the sampling stage.

19 Claims, 11 Drawing Sheets

(56) References Cited

U.S. PATENT DOCUMENTS

| | | |
|---|---|---|
| 6,909,637 B2 | 6/2005 | Nelson et al. |
| 7,142,004 B2 | 11/2006 | Carlson |
| 7,212,056 B1 | 5/2007 | Belov |
| 7,332,780 B2 | 2/2008 | Matsuda et al. |
| 7,362,154 B2 | 4/2008 | Mo |
| 7,425,855 B2 | 9/2008 | Chen et al. |
| 7,476,583 B2 | 1/2009 | Terauchi |
| 7,504,850 B2 | 3/2009 | Kuboyama et al. |
| 7,525,362 B1 | 4/2009 | Lesea et al. |
| 7,619,455 B2 | 11/2009 | Carlson et al. |
| 7,719,304 B1 | 5/2010 | Clark et al. |
| 7,733,144 B2 | 6/2010 | Guo et al. |
| 7,741,877 B2 | 6/2010 | Roche et al. |
| 7,782,107 B2 | 8/2010 | Dixit |
| 7,982,515 B2 | 7/2011 | Nakamura |
| 8,324,951 B1 | 12/2012 | Zarkesh-Ha et al. |
| 8,384,419 B2 | 2/2013 | Lavery et al. |
| 8,493,120 B2 | 7/2013 | Choudhunj et al. |
| 8,547,155 B2 | 10/2013 | Hoist et al. |
| 2006/0267653 A1 | 11/2006 | Fulkerson |
| 2008/0115023 A1 | 5/2008 | Carlson |
| 2008/0180153 A1* | 7/2008 | Sachdev ............ G11C 11/4125 327/208 |
| 2012/0306535 A1 | 12/2012 | Clark et al. |
| 2014/0077854 A1 | 3/2014 | Clark et al. |
| 2014/0240017 A1* | 8/2014 | Cheng ................ H03K 3/35625 327/203 |
| 2015/0008968 A1* | 1/2015 | Ma ....................... H03K 5/1565 327/175 |

OTHER PUBLICATIONS

Chavan, A. et al., "Hardened Flip-Flop Optimized for Subthreshold Operation Heavy Ion Characterization of a Radiation," Journal of Low Power Electronics and Applications, ISSN 2079-9268, vol. 2, May 24, 2012, pp. 168-179.

Faccio, F. et al., "Single Event Effects in Static and Dynamic Registers in a 0.25 μm CMOS Technology," IEEE Transactions on Nuclear Science, vol. 46, No. 6, Dec. 1999, pp. 1434-1439.

* cited by examiner

DATA REGISTER FOR RADIATION HARD APPLICATIONS

TECHNICAL FIELD

The disclosure relates to data storage elements.

BACKGROUND

Data storage elements in integrated circuits are subject to disturbance or upset by cosmic rays or other energetic particles. Such particles and disturbances are a risk in all environments and particularly in harsh and high-reliability applications such as satellites and aircraft. It is therefore desirable to mitigate such upsets to preserve proper functionality.

SUMMARY

The techniques of this disclosure may be implemented in a data storage element to mitigate disturbances caused by cosmic rays or other energetic particles. In general, the effect of an energetic particle strike on a device is to turn the device "on" temporarily, regardless of the state of the gate voltage. Turning a device "on" when not intended may result in errors that can propagate to downstream circuit elements, causing circuit errors. The techniques and circuits described herein can help to mitigate against incorrect "turn on" and thereby reduce downstream error propagation.

According to one example of this disclosure, a circuit comprises one or more data storage elements that include one or more sampling stages configured to sample a data value, the sampling stage comprising a plurality of p-type devices, wherein at least one of the plurality of p-type devices is non-collinear relative to the other p-type devices, and a plurality of n-type devices, wherein at least one of the plurality of n-type devices is non-collinear relative to the other n-type devices. The data storage element further comprises one or more feedback stages configured to maintain the data value sampled by the sampling stage(s).

The details of one or more examples of the disclosure are set forth in the accompanying drawings and the description below. Other features, objects, and advantages of the disclosure will be apparent from the description and drawings, and from the claims.

DETAILED DESCRIPTION

This disclosure describes techniques and circuits that make use of several characteristics of solid-state devices to potentially reduce, filter, or prevent data upset caused by fast localized charge deposition by energetic particles. Instead of using exotic circuit elements or large, slow, cumbersome circuit elements to achieve these ends, the techniques of this disclosure utilize various arrangements of devices and utilize various characteristics of devices to potentially reduce the effects of disturbances or upsets caused by cosmic rays or other energetic particles.

Figure 1A:
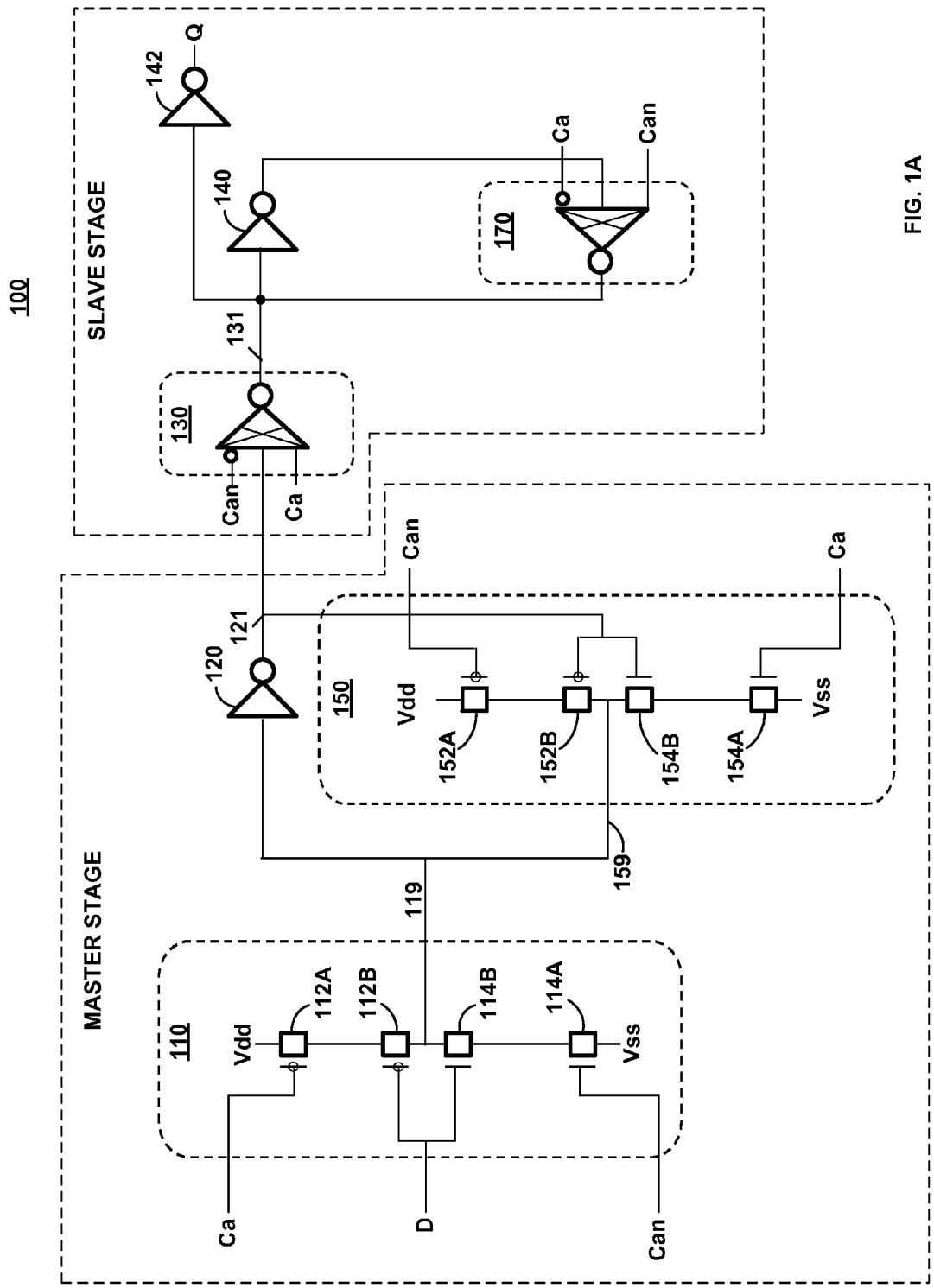
FIG. 1A shows a circuit schematic of a data storage element with single-event sensitive elements.

FIG. 1A shows an example circuit diagram of data storage register 100. Data storage register 100 is an example of a simplified clocked-inverter flip-flop that is configured to sample a data value at input D and store that data value internally and transmit a copy of the value at output Q. In the example of FIG. 1A, essentially all of the circuit elements of data storage register 100 are potentially sensitive to a hit (e.g., an impact) by an energetic particle. The effect of a "hit" may cause a temporary drain-to-source short of the device (e.g. the transistor device) being hit. The gate node of a device being hit is generally not significantly affected, although it is still possible that that gate node could be affected.

In the case of data storage registers and latches, a hit may cause a temporary disturbance (also called a "single-event upset") of the drain and source nodes of the device being hit. If the upset involves a device in a data storage element, the temporary upset can potentially overwrite the data stored in the latch or register until the next write operation. Additionally, a disturbance of a node typically propagates to signals downstream from the hit location. If any of these signals involve clocks or other sensitive signals of data storage elements, the disturbance may potentially corrupt the data in the downstream storage elements. This disclosure introduces techniques for mitigating the effect of energetic particle hits by means of several mechanisms, as will be described in more detail below with respect to FIGS. 2-6.

Data storage element 100 includes a Master stage composed of elements 110, 120 and 150, and a Slave stage composed of elements 130, 142, 140 and 170. These components as described represent sampling elements, forward elements, feedback elements as well as an output element. The sampling elements include clocked inverters 110 and 130. The forward elements include inverters 120 and 140. The feedback elements include non-clocked inverters 150 and 170. The output element includes inverter 142. Collectively referring to clocked inverter 150, and clocked inverter 170 as feedback elements is intended to simplify explanation of the function of data storage element 100 and should not be construed to imply any restrictions on the functionality of these elements. In the FIGS. of this disclosure, a triangle without an X through it (e.g. inverter 120, inverter 140, and inverter 140) is generally intended to represent a non-clocked inverter while, a triangle with an X through it (e.g. inverter 130 and inverter 170) is generally intended to represent a clocked inverter similar to 110 and 150. As will be explained in greater detail below, the clocked inverters shown as triangles with X's and the non-clocked inverters shown as triangles without X's generally have structures similar to other devices described in more detail in this disclosure. Therefore, the use of the triangles with and without X's to represent clocked and non-clocked inverters is intended to simplify the circuit diagrams of FIGS. 1A and 2A and to simplify the explanation thereof.

Figure 1B:
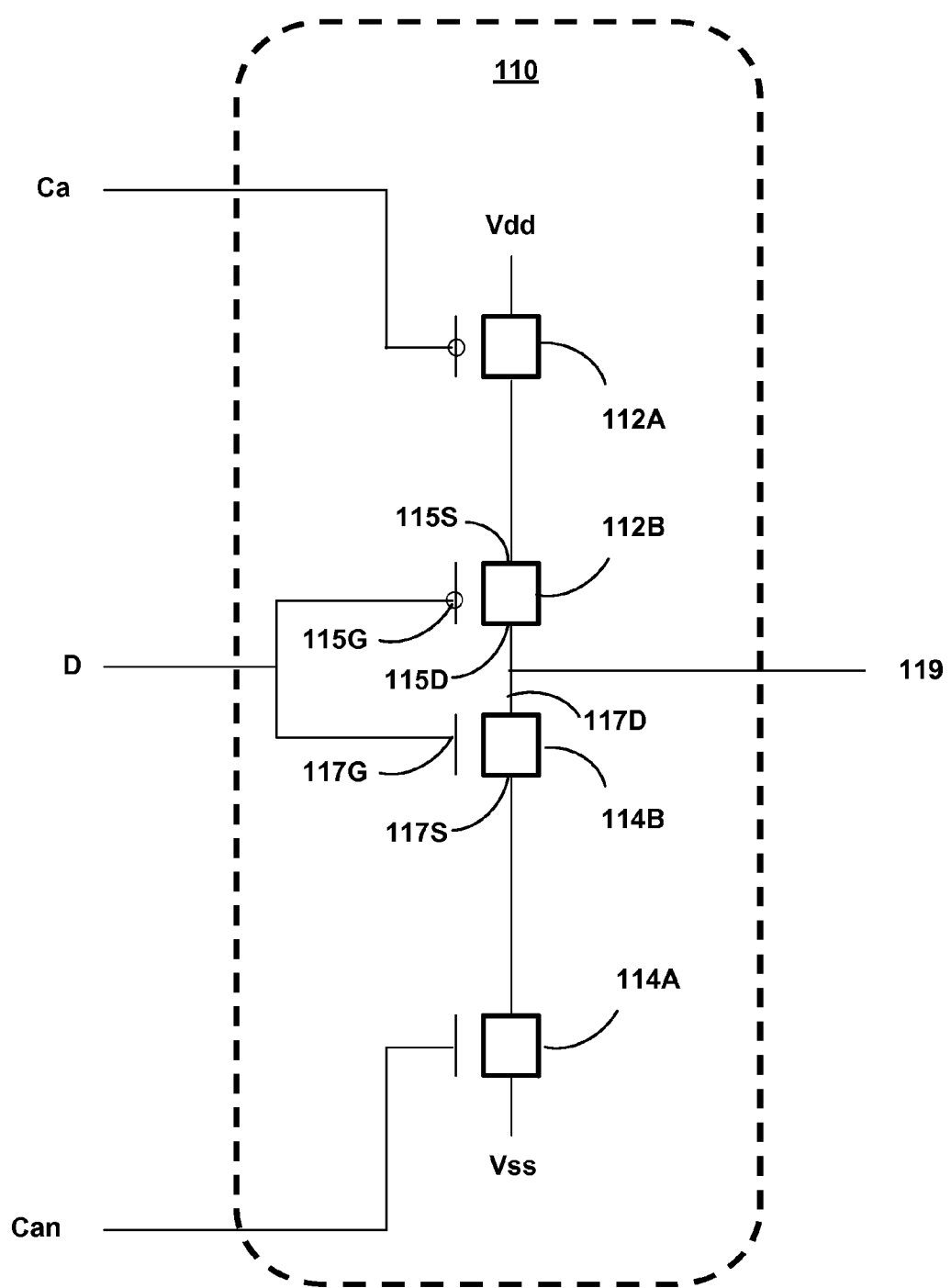
FIG. 1B shows a more detailed circuit schematic of the sampling stage of the data storage element of FIG. 1A.

Sampling stage 110 includes a clocked inverter configured to sample a value present at input D. FIG. 1B shows a more detailed view of sampling stage 110. Sampling stage 110 includes p-type devices 112A and 112B (collectively p-type devices 112) and n-type devices 114A and 114B (collectively n-type devices 114). In the example of FIGS. 1A and 1B, p-type devices 112 generally exhibit the opposite behavior of n-channel devices 114. In this context, opposite behavior means that while n-channel devices 114 turn "on" in response to a high gate voltage, p-type devices 112 turn "on" in response to a low gate voltage. Similarly, opposite behavior means that while n-channel devices 114 turn "off" in response to a low gate voltage, p-type devices 112 turn "off" in response to a high gate voltage.

As shown in FIG. 1B, P-type device 112B includes gate 115G, source 115S, and drain 115D. When the voltage at gate 115G, which corresponds to input D, is low, then current flows from source 115S to drain 115D. P-type device 112A generally behaves in the same manner described for p-type device 112B, but the gate voltage of p-type device 112A is a function of clock signal Ca instead of input D. N-type device 114B includes gate 117G, source 117S, and drain 117D. When the voltage at gate 117G, which corresponds to input D, is high, then current flows from drain 117D to source 117S. N-type device 114A generally behaves in the same manner described for n-type device 114B, but the gate voltage of n-type device 114A is a function of clock signal Can instead of input D.

In the example of FIG. 1B, clock signals Ca and Can are the inverse of one another. Thus, Ca is low when Can is high, and Ca is high when Can is low. When D is high, Can is high, and Ca is low, then n-type devices 114 and p-type device 112A are "on," and p-type device 112B is "off." P-type device 112B being "off" causes output 119 to be pulled low (i.e. to Vss in FIGS. 1A and 1B). When D is low, Can is high, and Ca is low, then p-type devices 112 and n-type device 114A are "on," and n-type device 114B is "off." N-type device 114B being "off" causes output 119 to be pulled high (i.e. to Vdd in FIGS. 1A and 1B). Thus, the value at output 119 is high when D is low and is low when D is high. Output 119 represents an intermediate output value. Thus, when Can is high and Ca is low, sampling stage 110 is in a sampling mode, where the value of output 119 is determined based on input D. When Can is low and Ca is high, then p-type device 112A and n-type device 114A are "off," in essence turning sampling stage 110 off, regardless of the value present at input D.

Intermediate value 119, which corresponds to the inverse of the value sampled at input D, is inverted by inverter 120, which may be a non-clocked inverter, meaning inverter 120 inverts an input regardless of any clock values, i.e. regardless of Ca and Can. Node 121 represents the output of inverter 120. Thus, node 121 corresponds to the inverse of intermediate output 119. The value at node 121 drives clocked inverter 130.

Clocked inverter 130 may, for example, include the same components as sampling stage 110 and may generally be configured to operate in the same manner as sampling stage 110. Clocked inverter 130, however, is configured to operate on the opposite clock cycle as sampling stage 110. Thus, when Ca is high and Can is low, then p-type device 112A and n-type device 114A will be "off," effectively turning off sampling stage 110. Clocked inverter 130, in contrast, will be "on" when Ca is high and Can is low. The input of clocked inverter 130 corresponds to the output of inverter 120 (i.e. node 121). As with sampling stage 110, the intermediate output (i.e. intermediate output 131 in FIG. 1A) of clocked inverter 130 is the inverse of the input (i.e. the value at node 121). The output of clocked inverter 130 is then inverted by non-clocked inverter 142. The output of non-clocked inverter 142 is shown in FIG. 1A as output Q, which subsequently corresponds to the value sampled at input D.

Data storage element 100 further includes feedback elements so that the value sampled at input D may be maintained at output Q. Clocked inverter 150 includes p-type devices 152A and 152B (collectively p-type devices 152) and n-type devices 154A and 154B (collectively n-type devices 154). In the example of FIG. 1A, p-type devices 152 generally exhibit the opposite behavior of n-channel devices 154. In this context, opposite behavior means that while n-channel devices 154 turn "on" in response to a high gate voltage, p-type devices 152 turn "on" in response to a low gate voltage. Similarly, while n-channel devices 154 turn "off" in response to a low gate voltage, p-type devices 152 turn "off" in response to a high gate voltage When the value at node 121 is low and Can is low, p-type devices 152 are "on," and n-type device 154B is "off," which causes output 159 to be pulled high (i.e. to Vdd in FIG. 1A). When the value at node 121 is high and Ca is high, n-type devices 154 are "on," and p-type device 152B is "off," which causes output 159 to be pulled low (i.e. to Vss in FIG. 1A). Thus, the value at output 159 is high when the value at node 121 is low and is low when the value at node 121 is high. Output 159 represents an intermediate output value. When Can is high and Ca is low, then p-type device 152A and n-type device 154A are "off," in essence turning clocked inverter 150 off, regardless of the value present at node 121.

Clocked inverter 150 and sampling stage 110 are turned on and off on opposite clock cycles. For example, when Can is low and Ca is high, then clocked inverter 150 is on and sampling stage 110 is off, while when Can is high and Ca is low, then clocked inverter 150 is off and sampling stage 110 is on. Thus, the input to non-clocked inverter 120 is either output 119 of sampling stage 110 or output 159 of clocked inverter 150 depending on the clock cycle.

Clocked inverter 130 generally includes the same arrangement of n-type devices and p-type devices as shown with respect to sampling stage 110 and operates generally in the same manner as sampling stage 110. Clocked inverter 130 is configured to be on and off on opposite clock cycles as clocked inverter sampling stage 110. Both clocked inverter 130 and clocked inverter 150 receive as input the output of non-clocked inverter 120 (i.e. the value at node 121).

Clocked inverter 170 includes the same arrangement of n-type devices and p-type devices as shown with respect to feedback stage clocked inverter 150 and generally operates in the same manner as clocked inverter 150. Clocked inverter 170 is configured to be on and off on the opposite clock cycles as clocked inverter 150. Clocked inverter 170 receives as input the output of non-clocked inverter 140.

Clocked inverter 130 and clocked inverter 170 are configured to operate on opposite clock cycles. When Ca is low and Can is high, then clocked inverter 130 is off and clocked inverter 170 is on. When Ca is high and Can is low, then clocked inverter 130 is on and clocked inverter 170 is off. Thus, when Ca is low and Can is high, then the input to non-clocked inverter 142 is the output of clocked inverter 170, and when Ca is high and Can is low, then the input to non-clocked inverter 142 is the output of clocked inverter 130.

Figure 1C:
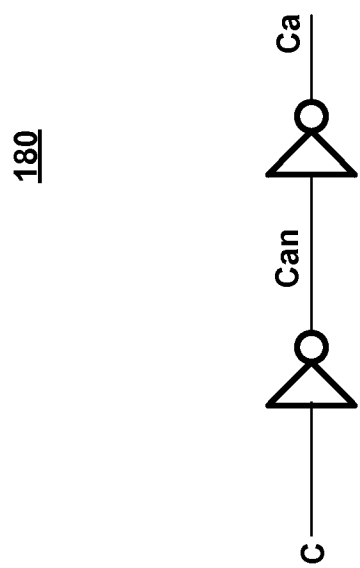
FIG. 1C shows an example of clock circuitry used to drive the data storage element of FIG. 1A.

FIG. 1C shows an example of clock circuitry 180 which may be used to generate the clock signals used to drive data storage element 100 of FIG. 1A. As can be seen in FIG. 1C, clock signal circuitry inverts a clock signal C to generate clock signal Can and then inverts clock signal Can to generate clock signal Ca. Thus, when clock C is high, Can is low, and Ca is high. When C is low, Can is high, and Ca is low. In this disclosure, when referring to a clock signal or value, the term inverse is generally used to mean the opposite. For example, the inverse of high is low, and the inverse of low is high. An inverter generally refers to a circuit element that is configured to output a high value in response to receiving a low value as an input and that is configured to output a low value in response to receiving a high value as an input.

Data storage element 100 of FIG. 1A is configured to sample input D during a low clock state (i.e. Can high and Ca low) and does not sample input D on a high clock state. Data storage element 100 propagates the value of D to output Q when the clock makes a transition from low to high (i.e. Ca switches from low to high and Can switches from high to low) and maintains that value at output Q when the clock switches from high to low until clock switches to high again. Thus, when data storage element 100 is sampling input D during a low clock state at time 1, data storage element 100 is also storing at value Q the previous value of input D that was sampled at time 0.

When C is low, sampling stage 110 and clocked inverter 170 are on, and clocked inverter 130 and clocked inverter 150 are off. As described above, when C is low, sampling stage 110 is sampling the value at input D, and inverter 140 and clocked inverter 170 are storing the value sampled at input on the previous low clock cycle. When C is low (i.e. Ca is low and Can is high), inverter 140 and clocked inverter 170 form a regenerative loop configured to hold the value of output Q.

When C is high, clocked inverter 170 is turned off, thus turning off the regenerative loop of inverter 140 and clocked inverter 170. When C is high, clocked inverter 150 is turned on, and thus, clocked inverter 150 and inverter 120 create a regenerative loop. Clocked inverter 130 sends the inverse of the regenerative loop of clocked inverter 150 and inverter 120 to inverter 142. Thus, when C is low, the value at node 131, which is inverted to form output Q, is supplied by the regenerative loop of clocked inverter 170 and inverter 140, and when C is high, the value at node 131 is supplied by the regenerative loop of clocked inverter 150 and inverter 120 as sampled by clocked inverter 130.

Many variations of these representative elements can be used to perform the basic flip-flop function, such as more or fewer inverter stages, various signal connection points, and duplication, omission or addition of various elements, including logical elements such as NAND and NOR gates, Set, Reset and Test functions.

In this disclosure, the term p-type device is generally meant to refer to any type of p-type transistor device, including but not limited to metal-oxide-semiconductor field-effect transistors (MOSFET), junction gate field effect transistors (JFET), a bipolar junction transistors (BJT). The term n-type device is generally meant to refer to any type of n-type transistor device, including but not limited to a bipolar junction transistors BJTs, JFETs, and MOSFETs.

Figure 2A:
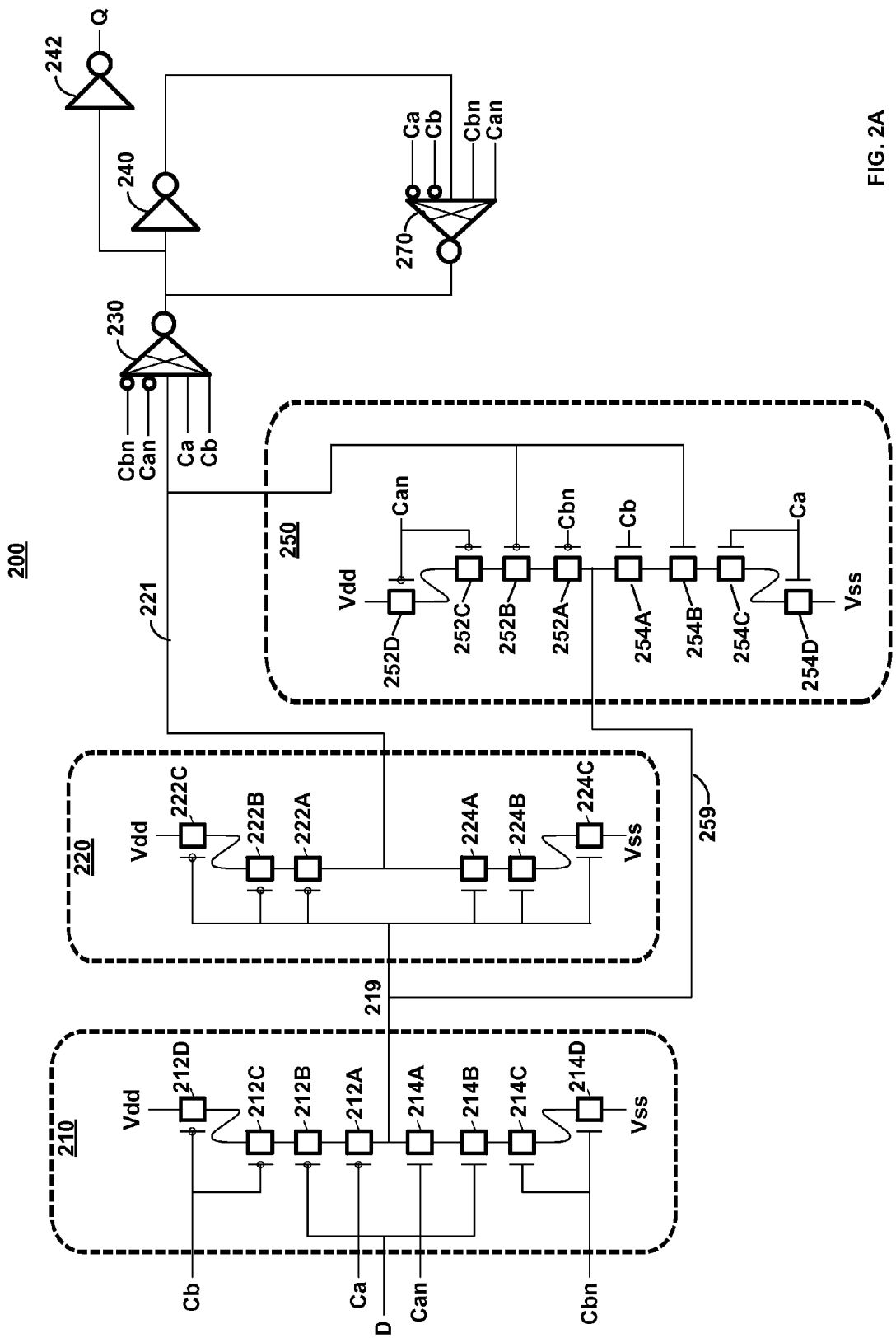
FIG. 2A shows a circuit schematic of a data storage element with single-event hardened elements.

FIG. 2A shows an example circuit diagram of data storage register 200. Data storage register 200 is an example of a clocked-inverter flip-flop that is configured to sample a data value at input D and store and subsequently propagate that data value to output Q. In the example of FIG. 2A, various circuit elements of data storage register 200 are protected against a hit by an energetic particle. Data storage element 200 includes Master and Slave stages, analogous to data storage element 100, as described previously. This includes sampling clocked inverter stages 210 and 230, forward inverter stages 220, 242 and 240, and feedback clocked inverter stages 250 and 270.

Sampling stage 210 is a clocked inverter that may be configured to sample a value present at input D, as will be explained in more detail below. Sampling stage 210 includes a plurality of p-type devices with at least one of the plurality of p-type devices being non-collinear relative to the other p-type devices and a plurality of n-type devices with at least one of the plurality of n-type devices being non-collinear relative to the other n-type devices.

Figure 2B:
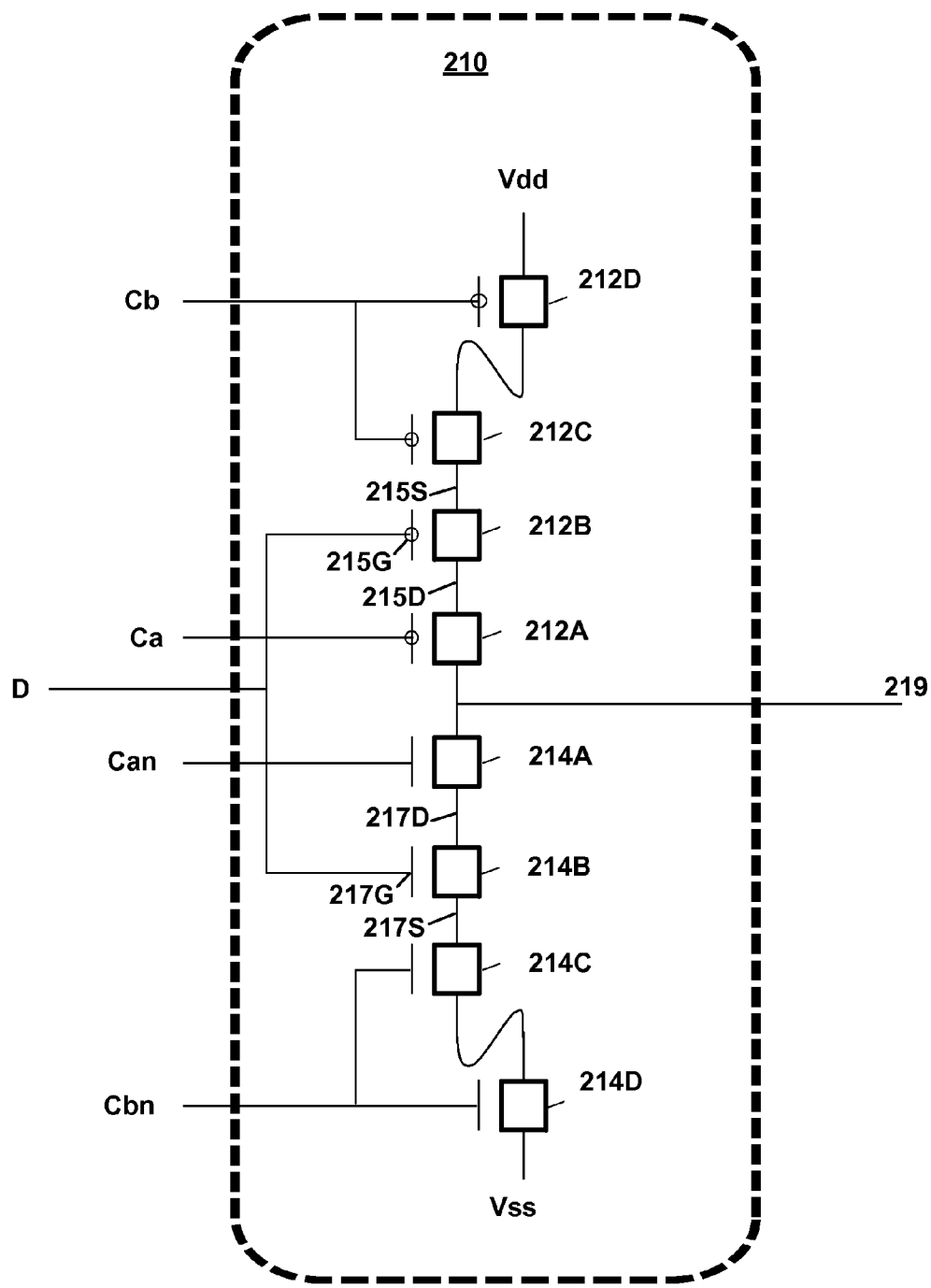
FIG. 2B shows a more detailed circuit schematic of the sampling stage of the data storage element of FIG. 2A.

FIG. 2B shows a more detailed view of sampling stage 210. Sampling stage 210 includes p-type devices 212A-212D (collectively p-type devices 212) and n-type devices 214A-214D (collectively n-type devices 214). In the example of FIGS. 2A and 2B, p-type devices 212 generally exhibit the opposite behavior of n-channel devices 214. In this context, opposite behavior means that while n-channel devices 214 turn "on" in response to a high gate voltage, p-type devices 212 turn "on" in response to a low gate voltage.

As shown in FIG. 2B, p-type device 212B includes gate 215G, source 215S, and drain 215D. When the voltage at gate 215G, which corresponds to input D, is low, then current flows from source 215S to drain 215D. P-type device 212A generally behaves in the same manner described for p-type device 212B, but the gate voltage of p-type device 212A is a function of clock signal Ca instead of input D. P-type devices 212B and 212C generally behave in the same manner described for p-type device 212B, but the gate voltage of p-type devices 212C and 212D is a function of clock signal Cb instead of input D.

N-type device 214B includes gate 217G, source 217S, and drain 217D. When the voltage at gate 217G, which corresponds to input D, is high, then current flows from drain 217D to source 217S. N-type devices 214A generally behave in the same manner described for n-type device 214C, but the gate voltage of n-type device 214A is a function of clock signal Can instead of input D. N-type devices 214C and 214D generally behave in the same manner described for n-type device 214B, but the gate voltage of n-type devices 214C and 214D is a function of clock signal Cbn instead of input D Clock signals Ca and Cb represent two instances of the same clock signal, and Can and Cbn represent two instances of the same clock signal. Ca/Cb and Can/Cbn are the inverse of one another. Thus, Ca and Cb are low when Can and Cbn are high, and Ca and Cb are high when Can and Cbn are low. When D is high, Can is high. Cbn is high. Ca is low, and Cb is low then n-type devices 214 and p-type devices 212A, 212C, and 212D are "on," and p-type device 212B is "off." P-type device 212B being "off" causes output 219 to be pulled low (i.e. to Vss in FIGS. 2A and 2B). When D is low, Can is high, Cbn is high, Ca is low, and Cb is low, then p-type devices 212 and n-type devices 214A. 214C, and 214D are "on," and n-type device 214B is "off." N-type device 214B being "off" causes output 219 to be pulled high (i.e. to Vss in FIGS. 2A and 2B). Thus, the value at output 219 is high when D is low and is low when D is high. Output 219 represents an intermediate output value. When Can and Cbn are low and Ca and Cb are high, then p-type devices 212A, 212C, and 212D and n-type devices 214A, 214C, and 214D are "off," in essence turning sampling stage 210 off, regardless of the value present at input D.

Intermediate value 219, which corresponds to the inverse of the value sampled at input D, is inverted by non-clocked inverter 220. Node 221 represents the output of inverter non-clocked inverter 220. Thus, node 221 corresponds to the inverse of intermediate output 219. The value at node 221 drives clocked inverter 230 and clocked inverter 250.

Figure 7:
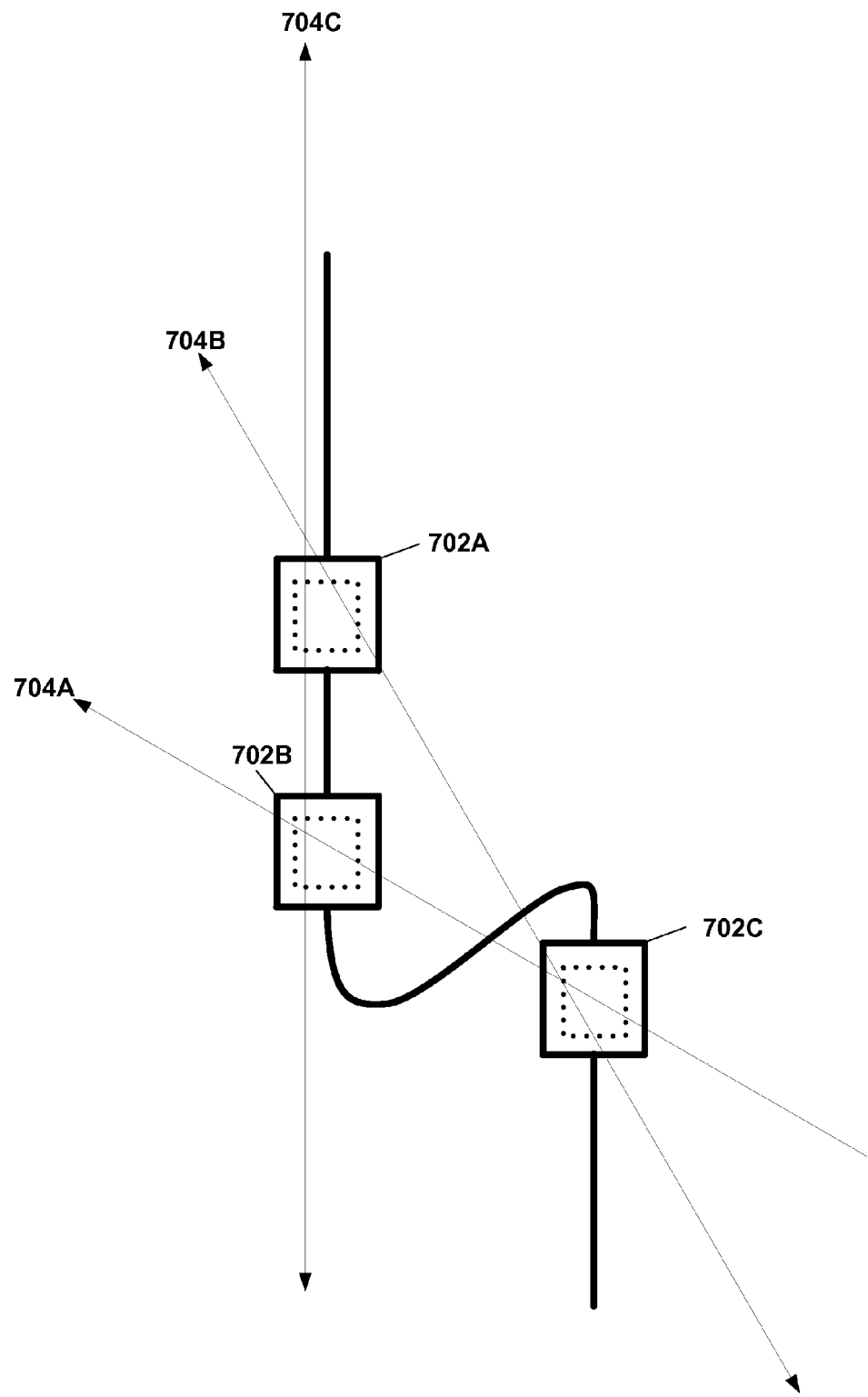
FIG. 7 shows an example of three, non-collinear devices.

Non-clocked inverter 220 includes p-type devices 222A, 222B, and 222C (p-type devices 222) arranged non-collinearly, as shown in FIG. 7. Non-clocked inverter 220 also includes n-type devices 224A, 224B, and 224C (n-type devices 224) arranged non-collinearly. If node 219/259 is high, then p-type devices 222 are all "off," n-type devices 224 are all "on," and the output (node 221) of non-clocked inverter 220 is low. If node 219/259 is low, then p-type devices 222 are all "on," n-type devices 224 are all "off," and the output (node 221) of non-clocked inverter 220 is high. Thus, the output (node 221) of non-clocked inverter 220 is the inverse of the input (node 219/259). As p-type devices 222 are non-collinear, an energetic particle travelling through p-type devices 222 can simultaneously intersect only any two of the three p-type devices 222, ensuring that at least one remains unperturbed, thus preventing the device output state from being perturbed. Similarly, as the three n-type devices 224 are non-collinear, an energetic particle travelling through n-type devices 224 cannot cause all three of the n-type devices 224 to be simultaneously perturbed, thus preventing the output state from being perturbed. Although not explicitly shown in FIG. 2A, non-clocked inverters 242 and 240 may include the same general arrangement of n-type and p-type devices as shown for non-clocked inverter 220.

Clocked inverter 230 may, for example, include the same components as sampling stage 210 and may generally be configured to operate in the same manner as sampling stage 210. Clocked inverter 230, however, is configured to operate on the opposite clock cycle as sampling stage 210. Thus, when Ca and Cb are high and Can and Cbn are low, then p-type devices 212A, 212C, and 212D and n-type devices 214A, 214C, and 214D will be "off," effectively turning off sampling stage 210. Clocked inverter 230, in contrast, will be "on" when Ca and Cb are high and Can and Cbn are low. The input of clocked inverter 230 corresponds to the output of non-clocked inverter 220 (i.e. node 221). As with sampling stage 210, the intermediate output (i.e. intermediate output 231 in FIG. 2A) of clocked inverter 230 is the inverse of the input. The output of clocked inverter 230 is then inverted by non-clocked inverter 242. The output of non-clocked inverter 242 is shown in FIG. 2A as output Q, which subsequently corresponds to the value sampled at input D.

Data storage element 200 further includes feedback elements so that the value sampled at input D may be maintained at output Q. Clocked inverter 250 includes p-type devices 252A-252B (collectively p-type devices 252) and n-type devices 254A and 254 B (collectively n-type devices 254). In the example of FIG. 2A, p-type devices 252 generally exhibit the opposite behavior of n-channel devices 254. In this context, opposite behavior means that while n-channel devices 254 turn "on" in response to a high gate voltage, p-type devices 252 turn "on" in response to a low gate voltage.

When the value at node 221 is low and Can and Cbn are low, p-type devices 252 are "on," and n-type device 254B is "off," which causes output 259 to be pulled high (i.e. to Vdd in FIG. 2A). When the value at node 221 is high and Ca is high and Cb is high, n-type devices 254 are "on," and p-type devices 252B are "off," which causes output 259 to be pulled low (i.e. to Vss in FIG. 2A). Thus, the value at output 259 is high when the value at node 221 is low and is low when the value at node 221 is high. Output 259 represents an intermediate output value. When Can and Cbn are high and Ca and Cb are low, then p-type devices 252A, 252C, and 252D and n-type device 254A, 254C, and 254D are "off," in essence turning clocked inverter 250 off, regardless of the value present at node 221.

Clocked inverter 250 and sampling stage 210 are turned on and off on opposite clock cycles. For example, when Can and Cbn are low and Ca and Cb are high, then clocked inverter 250 is on and sampling stage 210 is off, while when Can and Cbn are high and Ca and Cb are low, then clocked inverter 250 is off and sampling stage 210 is on. Thus, the input to non-clocked inverter 220 is either output 219 of sampling stage 210 or output 259 of clocked inverter 250 depending on the clock cycle.

Clocked inverter 230 operates generally in the same manner as sampling inverter 210 and is configured to be on and off on the same clock cycles as clocked inverter 250. Both clocked inverter 230 and clocked inverter 250 receive as input the output of non-clocked inverter 220 (i.e. the value at node 221).

Clocked inverter 270 generally operates in the same manner as feedback inverter 250 and is configured to be on and off on the same clock cycles as sampling stage 210. Clocked inverter 270, however, receives as input the output of non-clocked inverter 240.

Clocked inverter 230 and clocked inverter 270 are configured to operate on opposite clock cycles. When Ca is low and Can is high, then clocked inverter 230 is off and clocked inverter 270 is on. When Ca is high and Can is low, then clocked inverter 230 is on and clocked inverter 270 is off. Thus, when Ca is low and Can is high, then the input to non-clocked inverter 242 is the output of clocked inverter 270, and when Ca is high and Can is low, then the input to non-clocked inverter 242 is the output of clocked inverter 230.

Clocked inverter 250 and clocked inverter 270 generally form what may be referred to as a feedback stage, although it should be understood that a feedback stage may include additional elements or an alternate arrangement of elements as those shown in FIG. 2A.

According to the techniques of this disclosure, the clocked inverter of sampling stage 210 may be configured in a manner that reduces or eliminates errors resulting from hits by energetic particles. As can be seen in the circuit diagrams of FIGS. 2A and 2B, p-type device 212 A is non-collinear relative to p-type devices 212B, 212C, and 212D. Likewise, n-type device 214D is non-collinear relative to p-type devices 214A, 214B, and 214C. It is to be appreciated that other p-type type devices besides 212A and other n-type devices besides 214D may be made non-collinear relative to the other p-type devices and n-type devices. By making at least one of p-type devices 212 non-collinear relative to the other p-type devices, then a single energetic particle cannot affect the operation of all of p-type devices 212 causing output 221 to be incorrectly pulled high to Vdd. Similarly, by making at least one of n-type devices 214 non-collinear relative to the other n-type devices, then a single energetic particle cannot affect the operation of all of n-type devices 214 causing output 221 to be incorrectly pulled low to Vss. These techniques described in detail with respect to the clocked inverter of sampling stage 210 may also be implemented with respect to clocked inverters 230, 250, and 270 as well. In other words, clocked inverters 230, 250, and 270 may include an arrangement of non-collinear devices similar to the non-collinear devices described with respect to sampling stage 210.

The term "non-collinear," as used in this disclosure, generally describes a physical positioning of devices relative to one another, such as devices 212 and devices 214, within the circuit layout such that a single straight line or particle track cannot intersect the sensitive regions of all devices. In other words, non-collinear generally means that the devices are arranged in such a way that the sensitive portions of the devices cannot be connected by a straight line of a finite width. Non-collinearity is represented in FIGS. 2A, 2B, and 3-6 by an offset position of a device. For example, in FIG. 2A, device 214D is shown located in an offset position relative to devices 214A, 214B, and 214C, indicating that devices 214A, 214B, 214C, and 214D are non-collinear. P-type devices and n-type devices when implemented in a circuit have finite areas, portions of which may be sensitive to hits by energetic particles. In this disclosure, saying that devices are non-collinear generally refers to the sensitive areas of those devices and not necessarily to the entirety of the devices. It should be noted, however, that in some implementations, the sensitive region of a device may in fact be the entirety of the device or may even be larger than the entirety of the device.

As can be seen in FIG. 2A, p-type device 252A is non-collinear relative to p-type devices 252B, 252C, and 252D. Likewise, n-type device 254D is non-collinear relative to p-type devices 254A, 254B, and 254C. It is to be appreciated that other p-type devices besides 252A and other n-type devices besides 254D may be made non-collinear relative to the other p-type devices and n-type devices. By making at least one of p-type devices 252 non-collinear relative to the other p-type devices within the element, then a single energetic particle cannot affect the gate nodes of all of p-type devices 252 causing the output of clocked inverter 250 to be incorrectly pulled high to Vdd. Similarly, by making at least one of n-type devices 254 non-collinear relative to the other n-type devices, then a single energetic particle cannot affect the gate nodes of all of n-type devices 254 causing the output of clocked inverter 250 to be incorrectly pulled low to Vss.

Figure 2C:
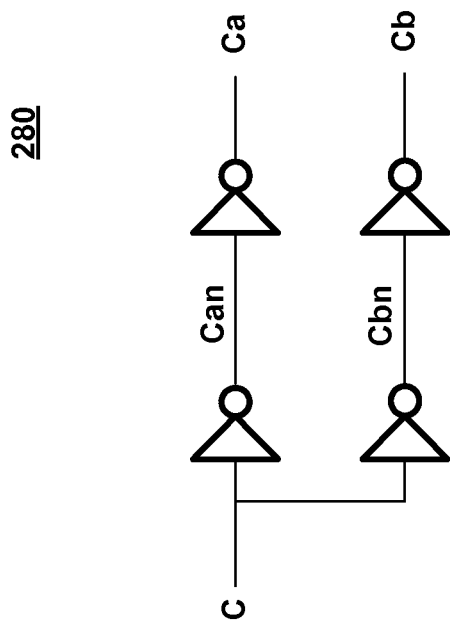
FIG. 2C shows an example of clock circuitry used to drive the data storage element of FIG. 2A.

Additionally, as can be seen by the circuit diagrams of FIGS. 2A and 2B, p-type device 212D is driven by a different clock signal than p-type devices 212A and 212B, and n-type device 214A is driven by a different clock signal than p-type devices 214C and 214D. Similarly, p-type device 252D is driven by a different clock signal than p-type devices 252A and 252B, and n-type device 254A is driven by a different clock signal than p-type devices 254C and 254D. As can be seen in FIGS. 2A and 2C, drivers of the clock true (C) and complement (Cn) signals have been sub-divided into two matched sets of clock signals, (a) and (b), each containing both true and complement outputs. By placing driver set (a) physically distant from driver set (b), the probability of both sets being upset by a single particle may be made acceptably low. Then, by using set (a) to drive one or two of the three select devices within each non-collinear group of the clocked inverter and set (b) to drive the other select device(s) within the group, an upset of either one of the clock sets cannot cause the full group to be selected, thus preventing an erroneous input selection.

In the clocked inverter stack configuration shown in FIG. 2A, the data (D) input devices have been located one "rung" away from the clocked inverter output node in order to allow the inside selection devices (212D and 214A) to help isolate the output from input-coupled noise during the deselected state. By one rung away, it is meant that p-type device 212C and n-type device 214B are not directly next to output node 259 in order to reduce disturbance on node 259. Many such configuration permutations of this nature are possible within the framework of this disclosure.

FIG. 2C shows an example of clocking circuitry 280, which may be configured to generate the clock signals used to drive data storage register 200. Clocking circuitry 280 of FIG. 2C may be configured to generate a first clock signal (e.g. Ca or Cb) and a second clock signal (e.g. the Cb or Ca). The first clock signal drives at least one p-type device of the plurality of p-type devices in sampling stage 210, and the second clock signal drives a different one of the p-type devices of the plurality of p-type devices in sampling stage 210. Clocking circuitry 280 may also be configured to generate a third clock signal (e.g. Can or Cbn) and a fourth clock signal (e.g. Cbn or Can). The third clock signal may be configured to drive at least one n-type device of the plurality of n-type devices in sampling stage 210, and the fourth clock signal drives a different one of the n-type devices of the plurality of n-type devices in sampling stage 210. As described above, the four clock signals generated by clocking circuitry 280 may also drive other circuit elements of data storage register 200.

Figure 3:
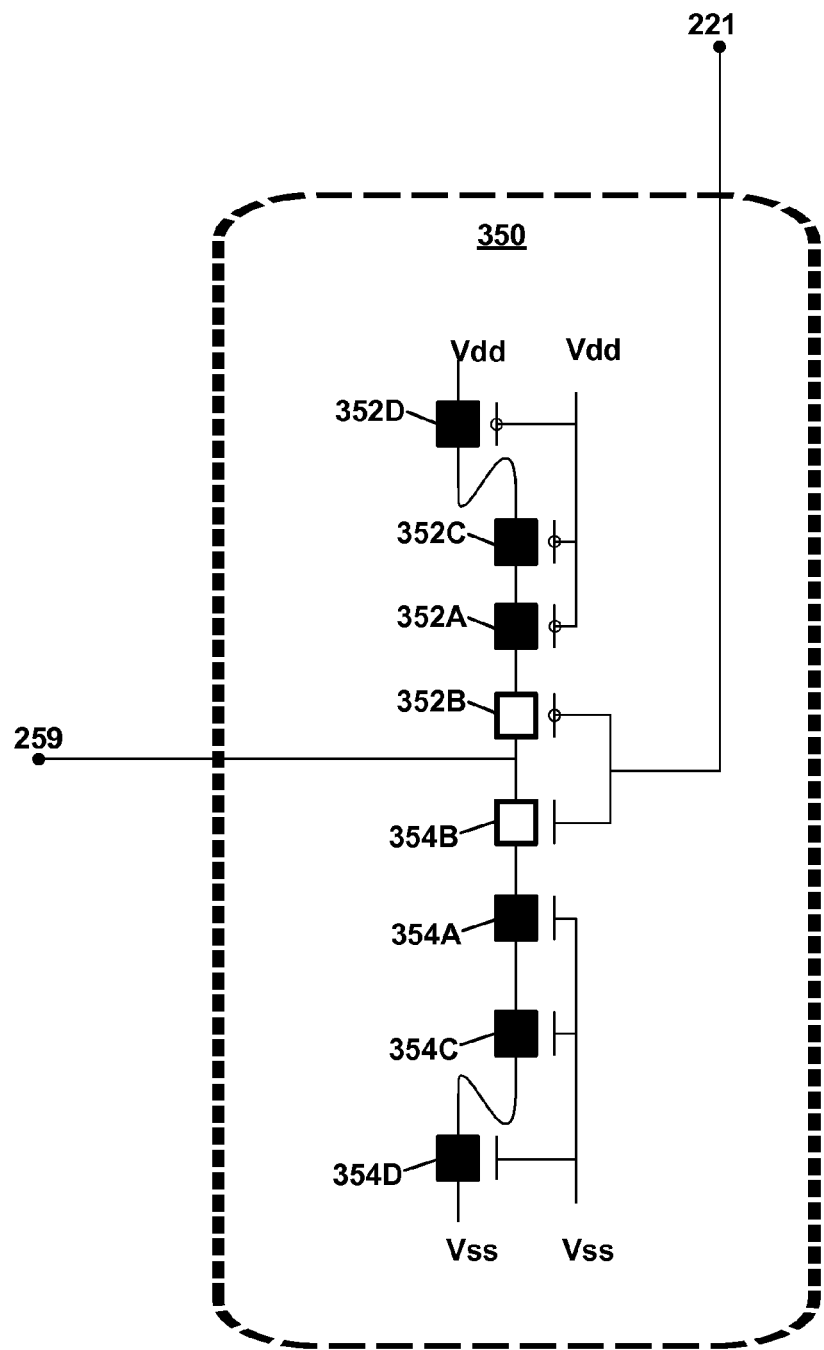
FIG. 3 shows an alternate configuration of a clocked inverter that may be used in conjunction with the data storage element of FIG. 2A.

FIG. 3 shows feedback filter inverter 350, which is an alternate configuration for clocked inverters 250 and/or 270 of FIG. 2A. Thus, in some implementations of the techniques of this disclosure, clocked inverters 250 and/or 270 of FIG. 2A may be replaced by feedback filter inverter 350 of FIG. 3. Feedback filter inverter 350 includes p-type devices 352A, 352B, 352C, and 352D (collectively p-type devices 352) and n-type devices 354A, 354B, 354C, and 354D (collectively n-type devices 354). In the example of FIG. 3, n-type devices 352A, 352C, and 352D may be selected to be low VT devices. Similarly, n-type devices 354A, 354C, and 354D may also be selected to be low VT devices. Input 221 is connected to the gate of p-type device 352B and the gate of n-type device 354B. The drain of p-type device 352B is connected to the drain of n-type device 354B.

In conventional CMOS circuit operation, an n-type device is "off" (i.e. non-conductive) when the gate voltage is low, and "on" (i.e. conductive) when the gate voltage is high. The converse is true for p-type devices. However, these states are not ideal. In other words, a device typically has some residual leakage current even when "off." The degree to which a device has residual leakage current in the "off" state is dependent on the Threshold Voltage (Vt) of the device. A "low" Vt device tends to allow greater leakage current in the off state than does a "high" Vt device. In the case of the greyed devices shown in FIG. 3, the device's Vt may be chosen to be a reduced value such that these devices provide a small leakage current in the "off" state, such that the device can retain the intended data output states.

To minimize the use of active stacked inverters, which involve the use of switched devices and thus increased complexity and activity-based power, the example in FIG. 3 contains low-current devices within the feedback filter inverter stages, shown in grey. These filter devices may be configured to have a small drive current such that the propagation delay through the feedback stage (e.g. clocked inverter 250 and clocked inverter 270) is increased beyond the duration of the upset to the input of the feedback stage, such as a result from an energetic particle strike. Thus, this element is referred to herein as a feedback filter inverter stage, and effectively low-pass filters the input signal to prevent an upset event on the output of the forward stage 220 and 240 from propagating to the output of the feedback stage and corrupting the correct data state stored on the input node of the forward stage (e.g. non-clocked inverter 220 and non-clocked inverter 240). This allows the use of normal simple fast inverters for the forward stages 220 and 240, significantly decreasing delay, power, area and the load on the clock inverters/buffers.

Further, in the configuration shown in FIG. 3, the drive current of the feedback filter inverter stage may be made sufficiently small to allow the input clocked inverter stage 210 and 230 to overdrive it directly during the master input selected state, removing the need for switched selection devices within the feedback stage. In the example shown in FIG. 3, the drive current of the feedback stage current limiter devices is reduced to a very small value by using low Vt devices in an "off" bias condition, relying on leakage to act as a keeper current to maintain the output state. This current may, for example, be about an order of magnitude larger (or more) than any parasitic leakage current. This can be accomplished through use of higher Vt devices, for example for sampling stage 210 and clocked inverter 230, in the input clocked inverter stage.

The approach using the filter feedback inverter requires the output node of the feedback filter stage to be protected against direct disturbance by a hit. As described previously, the input clocked inverter that is also driving this node is (largely) protected by the use of three stacked non-collinear devices. A similar approach is used for the filter devices in the feedback stage. The low-drive devices are configured in a non-collinear arrangement within the feedback stage. If any two devices are hit, the other device remains in a low-current state, preventing much of the charge from propagating to the output node of the feedback stage. Some propagation of charge is inevitable, so an analysis of the effect is appropriate to bound the minimum capacitance needed on the affected node to limit the response appropriately to prevent an unintended change of state.

This approach to the stacked inverter for the feedback stages does not contribute significantly to the delay or power consumption of the forward path of the flop because the stacked filter devices are not actively switched, and the low current drive of the feedback stage only flows momentarily during the switching transient.

Figure 4:
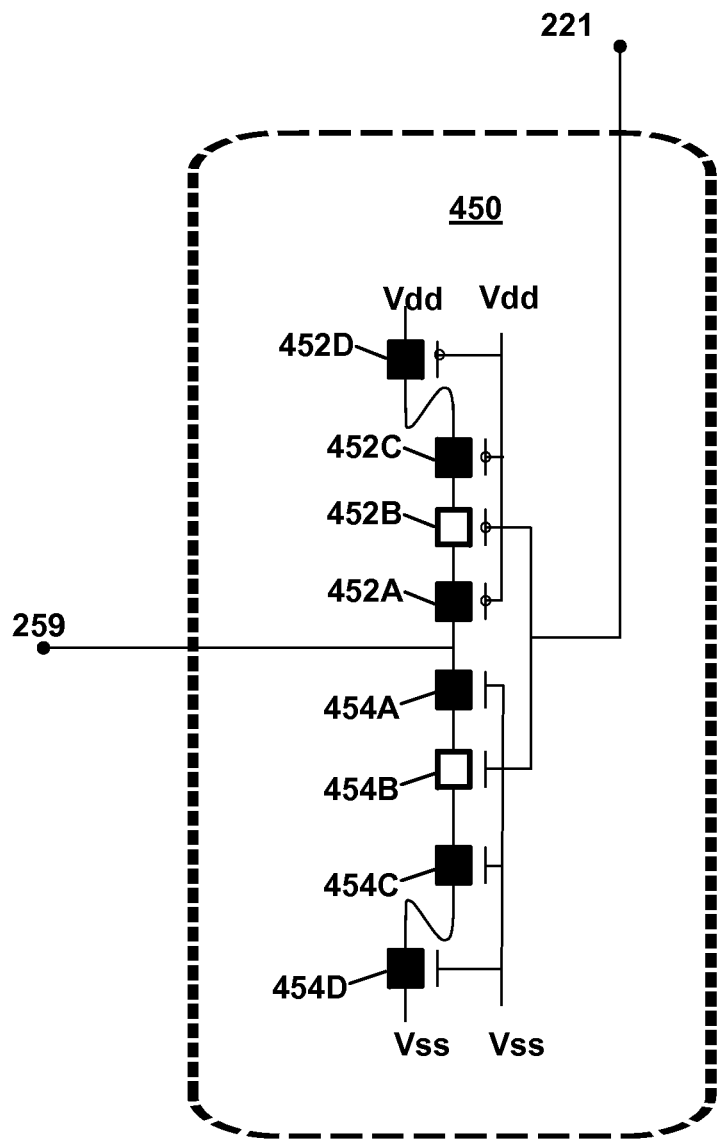
FIG. 4 shows an alternate configuration of a clocked inverter that may be used in conjunction with the data storage element of FIG. 2A.

FIG. 4 shows filter inverter 450, which is an alternate configuration for clocked inverter 250 and/or 270 of FIG. 2A. Thus, in some implementations of the techniques of this disclosure, clocked inverter 250 and/or 270 of FIG. 2A may be replaced by filter inverter 450 of FIG. 4. Filter inverter 450 includes p-type devices 452A. 452B, 452C, and 452D (collectively p-type devices 452) and n-type devices 454A, 454B, 454C, and 454D (collectively n-type devices 454). In the example of FIG. 4, n-type devices 452A. 452C, and 452D may be selected to be low VT devices. Similarly, n-type devices 454A, 454C, and 454D may also be selected to be low VT devices. Input 221 is connected to the gate of p-type device 452B and the gate of n-type device 454B FIG. 4 shows an alternative example configuration to that of FIG. 3 for the feedback stage in which the feedback input devices are moved one rung away from the output node within the stack, similar to the input clocked inverter stage 210, to help isolate the feedback output node from input coupling. In other words, unlike n-type device 354B and p-type device 352B of FIG. 3, n-type device 454B and p-type device 452B of FIG. 4 are separated by other devices (i.e. n-type device 454A and p-type device 452A). Many other permutations of such arrangements are possible within the framework of the techniques described in this disclosure. Such permutations and arrangements may offer certain tradeoffs that make some more suitable for certain applications and others more suitable for different applications.

Figure 5:
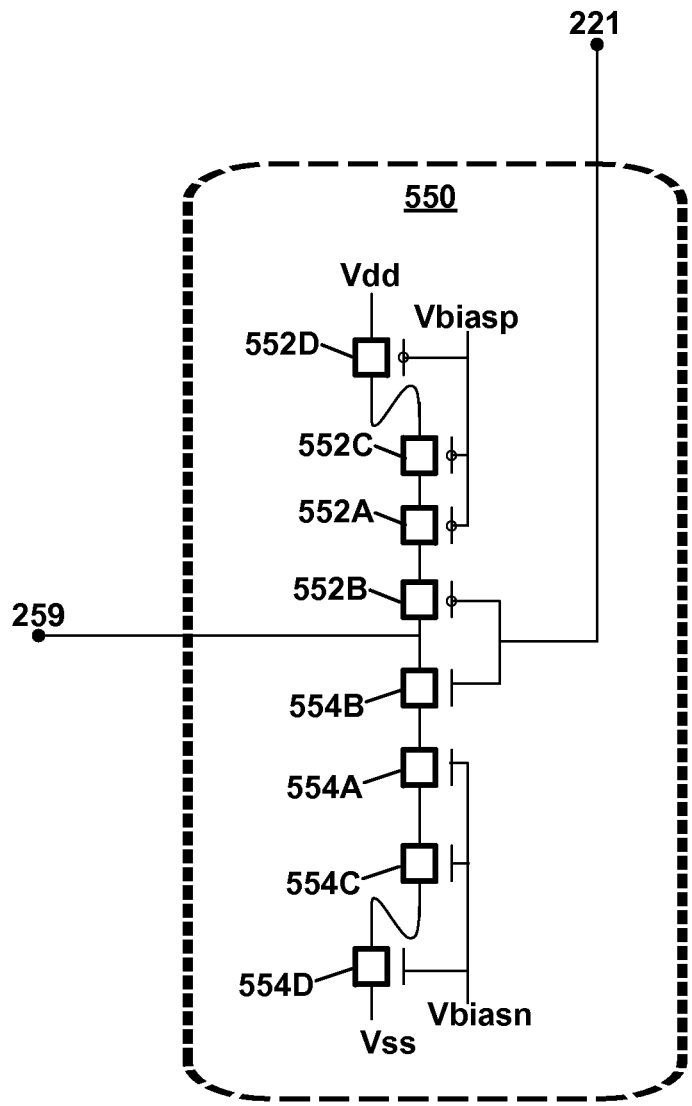
FIG. 5 shows an alternate configuration of a clocked inverter that may be used in conjunction with the data storage element of FIG. 2A.

FIG. 5 shows inverter 550, which is an alternate configuration for clocked inverter 250 and/or 270 of FIG. 2A. Thus, in some implementations of the techniques of this disclosure, clocked inverter 250 and/or 270 of FIG. 2A may be replaced by filter inverter 550 of FIG. 4. Filter inverter 550 includes p-type devices 552A, 552B, 552C, and 552D (collectively p-type devices 552) and n-type devices 554A, 554B, 554C, and 554D (collectively n-type devices 554). In the example of FIG. 5, n-type devices 552A, 552C, and 552D may be selected to be a particular type of VT device. Similarly, n-type devices 454A, 454C, and 454D may also be selected to be a particular type of VT devices. Input 221 is connected to the gate of p-type device 452B and the gate of n-type device 454B FIG. 5 shows an alternative configuration of the feedback stage described in FIG. 3 in which the current-limiting devices may or may not be low Vt devices, but are biased at controlled gate voltages to provide the intended current and duration of filtering. In the configuration of FIG. 5, rather than relying solely on the use of low-Vt devices in the 'off' state for a small residual leakage current, the device gate control voltages of the p-type filter devices (Vbiasp) and/or n-type filter devices (Vbiasn) may be controlled by any of a variety of means to adjust the device leakage current to a desired value, which may provide greater accuracy of control, reduced sensitivity to Vt process variation, adjustability to suit conditions and greater implementation flexibility. Thus, the filtering effect can be controlled external to the flip flop and dynamically optimized for mitigation of upsets and performance tradeoffs. Note that the low current drive of the feedback stage is not dc and only flows momentarily during the input switching transient. Hence the low current drive of the feedback stage is not a significant contribution to circuit power.

Figure 6:
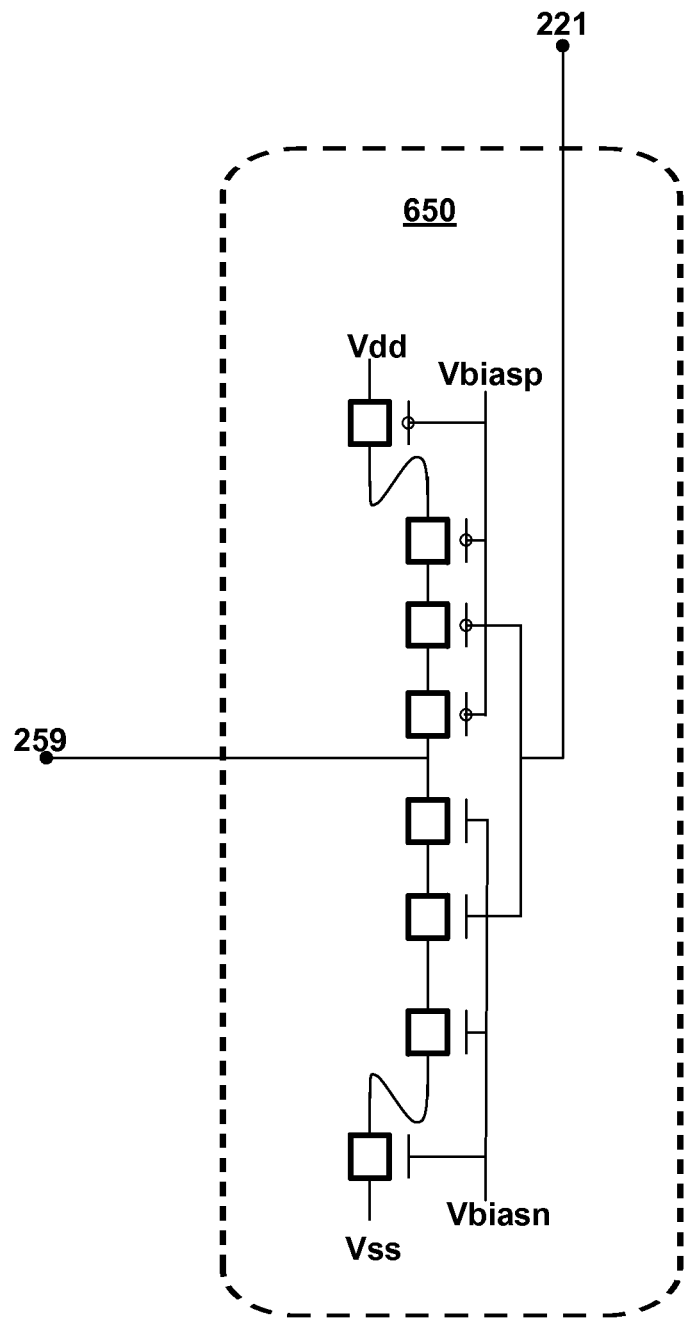
FIG. 6 shows an alternate configuration of a clocked inverter that may be used in conjunction with the data storage element of FIG. 2A.

FIG. 6 shows an alternative example configuration of the feedback stage similar to FIG. 4 in which the input devices of the feedback stage have been moved within the stack to be one rung away from the output node to help isolate the output node from input switching noise.

As introduced above, the term "non-collinear," as used in this disclosure, generally describes a physical positioning of devices relative to one another. FIG. 7 shows an example of three, non-collinear devices (702A-702C), which may be either n-type devices or p-type devices. The dotted lines within devices 702A-702C represent sensitive areas, such that the area enclosed by the dotted line corresponds to a sensitive region of the device, and area between the dotted line and the outer solid line corresponds to non-sensitive area of the device. Lines 704A-704C represent examples of particle tracks. A particle may potentially travel in either direction along the track shown in FIG. 7.

As can be seen in FIG. 7, devices 702A-702C are arranged such that a single particle track cannot intersect the active regions of all devices. Particle track 704A, for example, intersects the sensitive areas of devices 702B and 702C, but not the sensitive area of device 702A. Particle track 704B intersects the sensitive areas of devices 702A and 702C, but not 702B. Particle track 704C intersects the sensitive area of devices 702A, 702B, but not device 702C. Devices 702A-702C are arranged in such a manner that there exists no possible straight line particle path that intersects the sensitive area of all of devices 702A-702C.

The arrangement of devices 702A-702C shown in FIG. 7 represents only one of many possible arrangements that may be used to achieve non-collinearity. Moreover, although the example of FIG. 7 shows three devices, more than three devices may also be arranged non-collinearly.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples of the disclosure have been described. These and other examples are within the scope of the following claims.

What is claimed is:

1. A circuit comprising;
   a data storage element that includes:
   a sampling stage configured to sample a data value, the sampling stage comprising:
   a plurality of p-type devices comprising a first p-type device, a second p-type device, and a third p-type device, wherein a source of the first p-type device is connected to a drain of the second p-type device, wherein a source of the second p-type device is connected to a drain of the third p-type device, wherein layout of the circuit is such that at least one of the plurality of p-type devices is non-collinear relative to the other p-type devices,
   a plurality of n-type devices comprising a first n-type device, a second n-type device, and a third n-type device, wherein a source of the first n-type device is connected to a drain of the second n-type device, wherein a source of the second n-type device is connected to a drain of the third n-type device, wherein layout of the circuit is such that at least one of the plurality of n-type devices is non-collinear relative to the other n-type devices,
   a feedback stage configured to maintain the data value sampled by the sampling stage; and
   clocking circuitry configured to generate a first clock signal and a second clock signal, wherein the first clock signal drives at least one p-type device of the plurality of p-type devices and the second clock signal drives at least a different one of the p-type devices of the plurality of p-type devices, wherein the clocking circuitry is further configured to generate a third clock signal and a fourth clock signal, wherein the third clock signal drives at least one n-type device of the plurality of n-type devices and the fourth clock signal drives at least a different one of the n-type devices of the plurality of n-type devices.

2. The circuit of claim 1, wherein
   the second p-type device is configured to receive the data value;
   the second n-type device is configured to receive the data value, wherein a drain of the first n-type device is connected to a drain of the first p-type device.

3. The circuit of claim 1, wherein
   the first p-type device is configured to receive the data value;
   the first n-type device is configured to receive the data value.

4. The circuit of claim 1, wherein the feedback stage comprises a clocked inverter, wherein the clocked inverter comprises:
   a second plurality of p-type devices comprising a fourth p-type device, a fifth p-type device, and a sixth p-type device, wherein a source of the fourth p-type device is connected to a drain of the fifth p-type device, wherein a source of the fifth p-type device is connected to a drain of the sixth p-type device, wherein at least one of the second plurality of p-type devices is non-collinear relative to the other p-type devices of the second plurality of p-type devices; and a second plurality of n-type devices comprising a fourth n-type device, a fifth n-type device, and a sixth n-type device, wherein a source of the fourth n-type device is connected to a drain of the fifth n-type device, wherein a source of the fifth n-type device is connected to a drain of the sixth n-type device, wherein at least one of the second plurality of n-type devices is non-collinear relative to the other n-type devices of the second plurality of n-type devices.

5. The circuit of claim 4, the fourth p-type device is configured to receive an intermediate data value, and wherein the fifth p-type device has a lower voltage threshold than the fourth p-type device.

6. The circuit of claim 5, wherein the fourth p-type device is connected to an n-type device of the second plurality of n-type devices.

7. The circuit of claim 4, wherein the fourth n-type device is configured to receive the intermediate data value, and wherein the fifth n-type device has a lower voltage threshold than the fourth n-type device.

8. The circuit of claim 7, wherein the fourth n-type device is connected to a p-type device of the second plurality of p-type devices.

9. The circuit of claim 4, wherein the fourth p-type device is configured to receive an intermediate data value and a gate of the fifth p-type device is connected to a bias voltage.

10. The circuit of claim 9, wherein the fourth p-type device is connected to an n-type device of the second plurality of n-type devices.

11. The circuit of claim 4, wherein the fourth n-type device is configured to receive the intermediate data value and a gate of the fifth n-type device is connected to a bias voltage.

12. The circuit of claim 4, wherein the fourth n-type device is configured to receive the intermediate data value, the fourth p-type device is configured to receive the intermediate data value, and a gate of the fourth n-type device is connected to a gate of the fourth p-type device.

13. The circuit of claim 4, wherein the fourth n-type device is configured to receive the intermediate data value, the fourth p-type device is configured to receive the intermediate data value, and a gate of the fifth n-type device is connected to a gate of the fifth p-type device.

14. The circuit of claim 13, wherein the fourth p-type device has a lower voltage threshold than the fifth p-type device, and wherein the fourth n-type device has a lower voltage threshold than the fifth n-type device.

15. The circuit of claim 1, wherein the feedback stage comprise a non-clocked inverter, wherein the non-clocked inverter comprises:
a second plurality of non-collinear p-type devices; and
a second plurality of non-collinear n-type devices.

16. The circuit of claim 1, wherein the plurality of p-type devices are arranged on the circuit such that a single straight line cannot intersect a sensitive region of at least one of the p-type devices and the plurality of n-type devices are arranged on the circuit such that a single straight line cannot intersect a sensitive region of at least one of the n-type devices.

17. The circuit of claim 1, wherein the plurality of p-type devices comprises four or more p-type devices.

18. The circuit of claim 1, wherein the plurality of n-type devices comprises four or more n-type devices.

19. The circuit of claim 1, wherein the second plurality of p-type devices comprises at least three p-type devices and the second plurality of n-type devices comprises at least three n-type devices.

* * * * *